(12) United States Patent
Whitney

(10) Patent No.: US 7,180,719 B2
(45) Date of Patent: Feb. 20, 2007

(54) INTEGRATED OVERVOLTAGE AND OVERCURRENT DEVICE

(75) Inventor: Stephen J. Whitney, Lake Zurich, IL (US)

(73) Assignee: Littelfuse, Inc., Des Plaines, IL (US)

( * ) Notice: Subject to any disclaimer, the term of this patent is extended or adjusted under 35 U.S.C. 154(b) by 81 days.

(21) Appl. No.: 10/672,088

(22) Filed: Sep. 26, 2003

(65) Prior Publication Data

US 2004/0109275 A1    Jun. 10, 2004

Related U.S. Application Data

(63) Continuation-in-part of application No. 09/649,533, filed on Aug. 28, 2000, now abandoned.

(51) Int. Cl.
*H02H 5/04* (2006.01)

(52) U.S. Cl. ...................... 361/119; 361/103

(58) Field of Classification Search ............. 361/56, 361/91.1, 93.1, 103, 104, 106, 111, 119; 337/31
See application file for complete search history.

(56) References Cited

U.S. PATENT DOCUMENTS

| | | | | |
|---|---|---|---|---|
| 3,805,022 A | * | 4/1974 | Kulwicki et al. | 219/505 |
| 3,976,854 A | * | 8/1976 | Ishikawa et al. | 219/505 |
| 4,947,426 A | * | 8/1990 | Montano | 379/412 |
| 5,313,184 A | * | 5/1994 | Greuter et al. | 338/21 |
| 5,720,859 A | * | 2/1998 | Czubarow et al. | 204/157.43 |
| 6,023,403 A | * | 2/2000 | McGuire et al. | 361/106 |
| 6,353,236 B1 | * | 3/2002 | Yatsuo et al. | 257/77 |
| 6,628,498 B2 | * | 9/2003 | Whitney et al. | 361/119 |
| 6,854,176 B2 | * | 2/2005 | Hetherton et al. | 29/623 |

FOREIGN PATENT DOCUMENTS

JP        10144506     * 11/1996

OTHER PUBLICATIONS

International Search Report for Appl. No. PCT.US04/31758 (3 pages).

* cited by examiner

*Primary Examiner*—Brian Sircus
*Assistant Examiner*—Danny Nguyen
(74) *Attorney, Agent, or Firm*—Bell, Boyd & Lloyd LLP

(57) ABSTRACT

An electrical circuit protection device has an overcurrent protection portion and an overvoltage protection portion. The overcurrent protection portion has a surface. The overvoltage protection portion is disposed on the surface and thermally coupled to the overcurrent protection portion. A number of terminations connect the overcurrent protection portion and the overvoltage protection portion to a printed circuit board or other electrical circuit.

48 Claims, 5 Drawing Sheets

INTEGRATED OVERVOLTAGE AND OVERCURRENT DEVICE

RELATED APPLICATIONS

The present application is a continuation-in-part application of U.S. patent application Ser. No. 09/649,533, filed Aug. 28, 2000 now abandoned, the disclosure of which is incorporated by reference.

BACKGROUND

The present disclosure relates to a circuit protection device for protecting electrical circuits against excessive voltage and current conditions. In particular, the disclosure relates to an integrated circuit protection device having a positive temperature coefficient (PTC) current limiter and voltage suppressor within a single package.

Many electrical and electronic circuits require overcurrent protection and overvoltage protection. FIG. 1 shows a circuit diagram of a typical circuit incorporating overcurrent and overvoltage protection. Generally, the overcurrent and overvoltage protection is obtained through at least two discrete devices. Each device provides protection for a specific application. For example, a discrete PTC current limiter 10 provides protection during overcurrent situations. In addition, a discrete semiconductor device 12 (e.g., a voltage suppressor) provides protection during excessive voltages. The two discrete devices are interconnected through printed circuit board wiring. Consequently, valuable space of the printed circuit board is utilized by the footprint of each discrete component.

It is well known that the resistivity of many conductive materials change with temperature. Resistivity of a positive temperature coefficient ("PTC") material increases as the temperature of the material increases. Many crystalline polymers, made electrically conductive by dispersing conductive fillers therein, exhibit this PTC effect. These polymers generally include polyolefins such as polyethylene, polypropylene and ethylene/propylene copolymers. Certain doped ceramics such as barium titanate also exhibit PTC behavior.

At temperatures below a certain value, i.e., the critical or switching temperature, the PTC material exhibits a relatively low, constant resistivity. However, as the temperature of the PTC material increases beyond this point, the resistivity sharply increases with only a slight increase in temperature.

Electrical devices employing polymer and ceramic material exhibiting PTC behavior have been used as overcurrent protection in electrical circuits. Under normal operating conditions in the electrical circuit, the resistance of the load and the PTC device is such that relatively little current flows through the PTC device. Thus, the temperature of the device due to $I^2R$ heating remains below the critical or switching temperature of the PTC device. The device is said to be in an equilibrium state (i.e., the rate at which heat is generated by $I^2R$ heating is equal to or less than the rate at which the device is able to lose heat to its surroundings).

If the load is short circuited or the circuit experiences a power surge, the current flowing through the PTC device increases and the temperature of the PTC device (due to $I^2R$ heating) rises rapidly to its critical temperature. At this point, a great deal of power is dissipated in the PTC device and the PTC device becomes unstable (i.e., the rate at which the device generates heat is greater than the rate at which the device can lose heat to its surroundings). The power dissipation only occurs for a short period of time (i.e., a fraction of a second), however, because the increased power dissipation will raise the temperature of the PTC device to a value where the resistance of the PTC device becomes so high that the current in the circuit is limited to a relatively low value. This new current value is enough to maintain the PTC device at a new, high temperature/high resistance equilibrium point, but will not damage the electrical circuit components. Thus, the PTC device acts as a form of a fuse, reducing the current flow through the short circuit load to a safe, relatively low value when the PTC device is heated to its critical temperature range.

Upon interrupting the current in the circuit, or removing the condition responsible for the short circuit (or power surge), the PTC device will cool down below its critical temperature to its normal operating, low resistance state. The effect is a resettable, electrical circuit protection device.

Overvoltages can be protected by the incorporation of semiconductor devices having voltage recovery characteristics like zener diodes or thyristors depending on the needs of the application.

Designing circuits having discrete electrical protection devices has a number of disadvantages. As mentioned previously, valuable space on the printed circuit board is occupied by two separate components. Printed circuit board designers are always looking for ways to reduce the footprint of components in an effort to reduce the circuit board space needed. Thus, it is desirable to reduce the size of integrated overcurrent and overvoltage protection devices.

Moreover, electrical coordination problems arise with the discrete devices making it difficult to assure coordination between the voltage suppressor protecting against overvoltage conditions and the thermal protector protecting during overcurrent conditions. Coordination between devices is important to eliminate damage to a circuit and its components in any overcurrent or overvoltage condition. One reason that makes coordination between the discrete devices difficult is because discrete devices are often times made by different manufacturers. As such, the burden is placed on the circuit board designer to coordinate the discrete devices together in order to obtain the proper overcurrent and overvoltage protection of the circuit and its components. Determining proper electrical coordination between the devices is not a simple procedure. It takes time to evaluate criteria of each device (e.g., $I^2t$ curves, etc.) to make sure that protection against excessive voltages and currents will result. In addition, specification tolerances for the discrete devices of different manufacturers may vary resulting in poor coordination between the discrete devices even when a proper evaluation is conducted by the designer.

Another concern with existing discrete devices is that the discrete devices may not be fast enough during overvoltage conditions for certain applications. To this extent, sensitive circuitry can easily be damaged.

SUMMARY

According to a disclosed example, a circuit protection device includes an overcurrent protection portion having a surface and an overvoltage protection portion disposed on the surface. The overvoltage protection portion is thermally coupled to the overcurrent protection portion. In addition, a number of terminations are configured to connect the overcurrent protection portion and the overvoltage protection portion to an electrical circuit.

In another example, an overcurrent and overvoltage protection device includes a first substrate that has a surface and an electrode disposed on the surface and a second substrate that has a top surface and a bottom surface and an electrode disposed on the bottom surface. Moreover, a PTC element is positioned between the first and second substrates and electrically connected to the electrodes. A voltage suppressor is disposed on the top surface of the second substrate and thermally coupled to the PTC element. In addition, a plurality of terminations are electrically connected to the PTC element and voltage suppressor.

In yet another example, a circuit protection device is provided with an overcurrent protection portion interposed between one or more substrate layers of a circuit board. Additionally, an overvoltage protection portion is attached to the circuit board and thermally coupled to the overcurrent protection portion via a heat transferring structure within a least one of the substrate layers. At least one terminal is configured to connect the circuit protection device to an electrical circuit.

DETAILED DESCRIPTION OF THE PRESENT EXAMPLES

The present disclosure includes an integrated circuit protection device for protecting electrical circuits against excessive voltage and excessive current conditions as well as a method for manufacturing the circuit protection device. The disclosed circuit device achieves overcurrent and overvoltage protection with a single discrete package. At the same time, the device provides accelerated PTC switching during an overvoltage condition due to a high degree of thermal coupling between a voltage suppressor and a PTC element. Moreover, the present device assures coordination between the voltage suppressor and the PTC element.

Generally, the presently disclosed device is a combination of an overvoltage protective device, such as a semiconductor device having characteristics similar to a zener diode or a thyristor (depending on the application) with an overcurrent protective device, such as a PTC current limiter. The two components are electrically, physically, and thermally coupled together as indicated in greater detail below.

Figure 2:
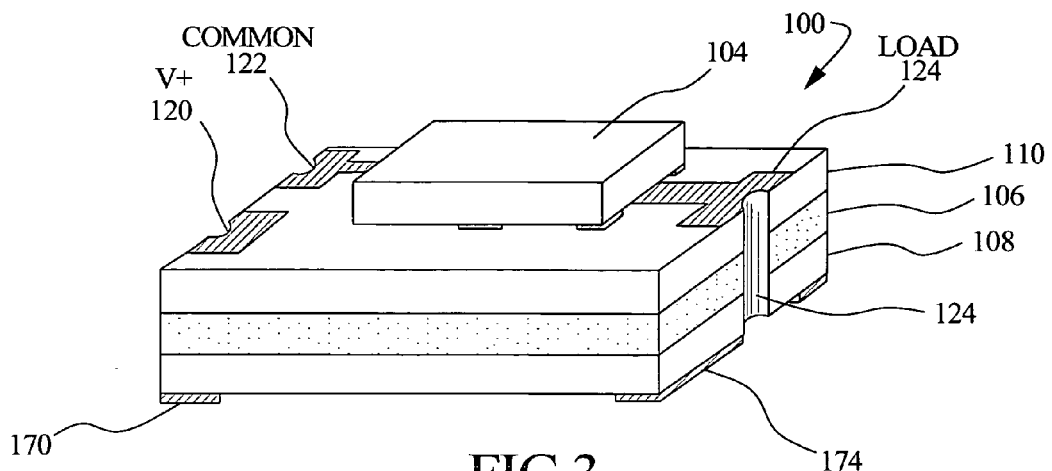
FIG. 2 illustrates a perspective view of an integrated circuit device according to the present disclosure.
Figure 3:
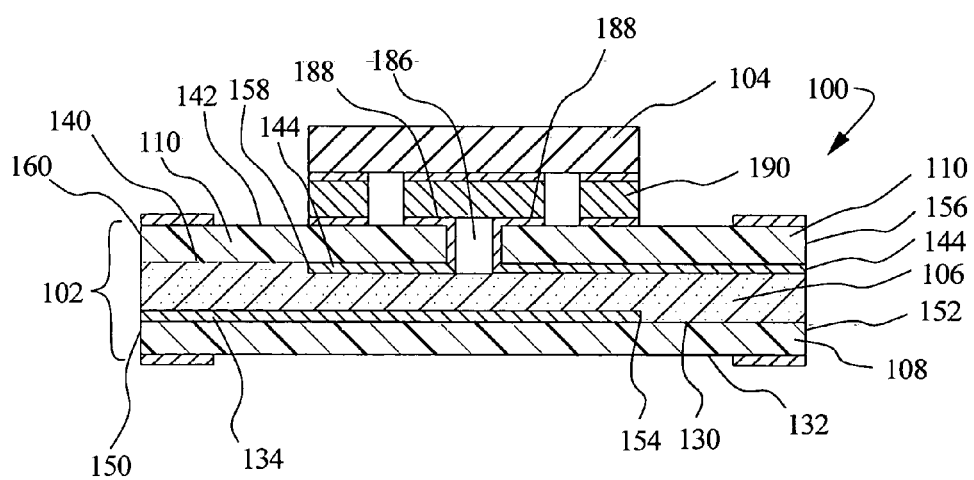
FIG. 3 illustrates a cross-sectional view of the integrated circuit device of FIG. 2.

FIGS. 2 and 3 illustrate an overcurrent and overvoltage protection device 100 in a single integral package. Generally, the device 100 includes a current limiting element such as PTC carrier 102 and a voltage suppressor 104 that are coupled together in the single integral package and can be also thermally coupled. The PTC carrier 102 includes a PTC element 106 interposed between first and second substrates 108, 110. The PTC carrier along with the first and second substrates 108, 110 constitute an overcurrent protection portion.

The PTC element 106 and the voltage suppressor 104 are electrically connected to terminations 120, 122, 124. Specifically, V+ termination 120 is electrically connected to the PTC element 106 by electrode 134. Common termination 122 is electrically connected to the anode of the voltage suppressor 104. Load termination 124 is electrically connected to the cathode of the voltage suppressor 104 and to the PTC element 106 by electrode 144. Nonetheless, the PTC element 106 and the voltage suppressor 104 are electrically insulated from one another generally in a region of the device 100 lying between the terminations 120, 122 and 124. In other words, the surfaces of the devices 104 and 106 are electrically insulated from one another with the only electrical connections between the devices 104 and 106 made via the terminations 120, 122, or 124 in this example. Alternatively, however, other examples could include electrical connections made through heat conducting vias, as will be discussed below.

The first and second substrates 108, 110 of the PTC carrier 102 are electrically insulating and provide support for the device 100. Suitable materials for use as the substrates include: FR-4 epoxy, ceramic, glass and melamine. A feature of FR-4, as an example, is that this type of material affords ease of patterning of circuitry and placement of components on the substrate.

The first substrate 108 has a top surface 130 and a bottom surface 132. A first electrode 134 is formed on the top surface 130. The second substrate 110 has a first (bottom) surface 140 and a second (top) surface 142. A second electrode 144 is formed on the first surface 140 of the substrate 110.

In general, the electrodes 134, 144 may be formed of any conductive metal, e.g., silver, copper, zinc, nickel, gold, and alloys thereof, and can be applied on the substrates 108, 110 in a variety of ways. For example, the metal may be applied as a laminate to the substrate. In this example, the laminate is then selectively removed through a photolithography or photoetching process. Alternatively, the metal can be applied through an additive process where the metal is applied through a variety of different processes—typically electrolyzed plating to the substrate. To this extent, the metal can be applied in a selective manner or as a continuous layer that is selectively removed to form the desired pattern. Another example of a process is depositing the metal on the substrate by any other conventional deposition method, e.g., vapor deposition, sputtering, etc.

The first electrode 134 extends to one end 150 of the first substrate 108, but not to the other end 152. As such, the first electrode 134 ends to an area 154 along the top surface 130 of the first substrate 108. On the other hand, the second electrode 144 extends across the bottom surface 140 from an end 156 of the second substrate 110 opposite the end 150 of the first substrate 108 from which the first electrode 134 extends. The second electrode 144 extends to an area 158 along the surface 140 of the second substrate but not to the other end 160 of the second substrate 110 (the other end 160 of the second substrate 110 being on the same side of the device as the end 150 from which the first electrode 108 extends). This offset configuration of the electrodes is important to make the proper electrical connections with the terminations 120, 122, 124.

The PTC element 106 is composed of a PTC composition that includes a polymer component and a conductive filler component. The polymer component may have a polyolefin having a crystallinity of at least 40%. Suitable polymers include polyethylene, polypropylene, polybutadiene, polyethylene acrylates, ethylene acrylic acid copolymers, and ethylene propylene copolymers. In an example, the polymer component includes polyethylene and maleic anhydride, e.g., Fusabond® brand manufactured and sold by DuPont. The conductive filler is dispersed throughout the polymer component in an amount sufficient to ensure that the composition exhibits PTC behavior. Alternatively, the conductive filler can be grafted to the polymer component.

Generally, the conductive filler component will be present in the PTC composition by approximately 25–75% by weight. Suitable conductive fillers to be used include powders, flakes or spheres of the following metals: nickel, silver, gold, copper, silver-plated copper or metal alloys. The conductive filler may also include carbon black, carbon flakes or spheres or graphite. Particularly useful PTC compositions have a resistivity at 25° Celsius of less than 5 ohm-cm, especially less than 3 ohm-cm, and preferably less than 1 ohm-cm, e.g., 0.5 to 0.1 ohm-cm.

The PTC element 106 is provided by extruding PTC material into thin sheets. The thin sheets of PTC material are interposed between large panels of first and second substrates 108, 110. Essentially, the PTC material is sandwiched between the first and second substrates 108, 110 to the PTC element 106 and makes direct and electrical contact with the electrodes 134, 144. The PTC material and substrates are subjected to heat and pressure. In this regard, the PTC element 106 fills the void or uneven surface created by the electrodes 134, 144 and the terminations 120, 122, 124 covering only a portion of the surfaces 130, 140 of the substrates. It is noted that the first and second substrates 108, 110 may comprise a singular circuit board where the PTC element 106 and electrodes 134, 144 are interposed within the circuit board comprised of the first and second substrates 108, 110.

The terminal configuration for the overcurrent and overvoltage device 100 has terminals 120, 122, 124 that are formed as castellated contacts on the respective ends of the first substrate and second substrate 108, 110. The castellated contacts include a metallized surface that extends from the top surface 142 of the second substrate 110 to the bottom surface 132 of the first substrate 108. In this example, the castellated contact 120, which is connected to voltage $V_+$, electrically contacts the substrate 108, and the PTC element 106, and electrode 134. It is also noted that physical contact of the $V_+$ contact 120 with the PTC element 106 (as well as physical contact by common contact 122 with the PTC element 106) has a negligible effect with respect to operation of the PTC element 106. Rather conductivity between the terminal 120 and the electrode 134 is primarily responsible for effecting electrical connection of the PTC element 106 to the terminal 120.

Similarly, load terminal 124, which is connected to the load, physically contacts substrate 108, and electrically contacts PTC element 106 by electrical contact with electrode 144. Further, electrode 134 is constructed such that it does not electrically contact terminals 122 and 124. An exemplary construction may include cutouts in the electrode 134 in the area of the terminals 122 and 124 to achieve this electrical isolation. Similarly, electrode 144 may include cutouts in the areas of terminals 120 and 122.

It should be noted that the exemplary terminal configuration of the device 100 is not limited with respect to the number, exact physical dimensions or placement of the terminations upon the substrate. In this regard, the location of the terminal configuration is due in part to the manufacturing process of the device. As stated earlier, the devices 100 can be manufactured from large panels or sheets of substrate and PTC material. The large panels or sheets are then cut into the discrete devices during the manufacturing process. Thus, the castellated contacts are cut in half forming a half circle termination. Moreover, some applications may require additional terminations to other components or equipment for protection.

Figures 4, 5:
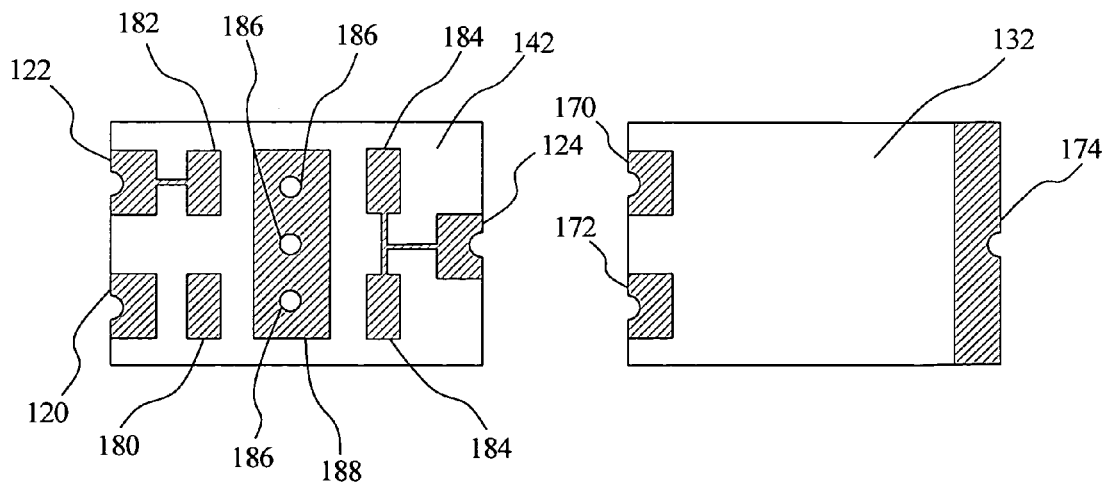
FIG. 4 illustrates a bottom view of the integrated circuit of FIG. 2.
FIG. 5 illustrates a top view of a PTC carrier of the integrated circuit device of FIG. 2.

As shown in FIG. 4, the bottom surface 132 of the first substrate 108 includes mounting pads 170, 172, 174 for mounting the device 100 to a printed circuit board (not shown). The mounting pads 170, 172, 174 may be formed at the same time as the castellated contacts. The mounting pads 170, 172, and 174 are used to mount the device 100 to the printed circuit board and provide termination connections to V+, common, and the load, respectively. Again, the mounting pads 170, 172, 174 are formed from a conductive metal that can be applied through any of the processes described previously.

As shown in FIG. 5, the second surface 142 of the second substrate 110 includes the castellated contacts 120, 122, 124 and additional mounting pads 180, 182, 184. Mounting pads 180, 182, 184 are positioned on the second substrate 110 according to the specification requirements of the footprint of the voltage suppressor 104. The castellated contacts 122, 124 are electrically connected to the voltage suppressor mounting pads 182, 184, respectively. This connection can be accomplished in a variety of ways such as by selectively metallizing the surface 142, for example.

As illustrated in FIGS. 4 and 5, one of the substrates, such as the second substrate 110, may include at least one heat transferring structure to thermally couple the voltage suppressor 104 to the PTC element 106. This structure may include a via or through hole 186 that extends from the top surface 142 to the bottom surface 144. The vias 186 are coated or plated with a conductive metal of the types described above or a conductive epoxy. Moreover, the metal may be laminated or deposited in the via 186 by similar methods to those described above with respect to the surfaces of the substrates. To this extent, a metallized area 188 may be formed around the vias 186 and/or on the surface 142 of the second substrate 110. As described in further detail below, the vias 186 act as a heat conducting structure (e.g., a heat pipe) conducting heat away from the voltage suppressor 104 to the PTC element 106. It is noted that the heat transferring structure is not limited to vias, holes or heat pipes, but may include thermally conductive epoxies or metals that are configured to be electrically insulative.

The voltage suppressor 104 is attached to the second substrate 110 by an attachment structure or bond 190 using, for example, standard reflow soldering techniques. To this extent, the bond 190, when made of solder, may also fill any remaining space in the vias 186. However, the vias 186 could also be completely plated through in which case no space remains in the vias 186 to be filled with solder. In this example, the solder is applied only on the mounting pads.

The voltage suppressor 104, in the above example, may have zener diode-like voltage-current characteristics. The voltage suppressor 104 protects the load from overvoltages applied at $V_+$ mounting pad termination 120 by clamping or limiting the voltage at the load to a voltage level $V_Z$ for positive voltages and $V_f$ for negative voltages. In this regard, the load is protected from excessive forward voltages as well as reverse polarity voltages.

Furthermore, as the voltage suppressor 104 experiences overvoltages it begins to heat due to increased power dissipation. The heat is conducted down the vias 186 like a heat pipe or a heat sink to the PTC element 106. In turn, the PTC element 106 switches to a high resistance state as a result of heat. In this state, current flow through the voltage suppressor 104 is limited, thereby preventing damage to the circuit. It should be noted that in this mode of operation, the switching of the PTC material is due to the combination of the heating of the voltage suppressor and the self-heating of the PTC material due to the rise in current.

The PTC element 106 will also switch into a current limiting mode if the load resistance is reduced sufficiently by an overload or a short circuit condition. In this scenario, the device provides traditional overcurrent protection of the circuit.

Additionally, when any of the above fault conditions are corrected and the power is cycled off and on, the device will reset automatically. To this extent, there is no changing of a fuse or manual resetting of a circuit breaker.

The disclosed integrated device 100 provides faster PTC switching during an overvoltage condition than can occur with discrete devices. This is due to the high degree of thermal coupling between the voltage suppressor 104 and the PTC element 106. Specifically, the heating effect of the PTC element 106 is accelerated and, in turn, the switching of the PTC element 106 to a high resistance condition occurs faster because the switching is related to the temperature. As a result, the integrated overvoltage and overcurrent device 100 described above protects a circuit against harmful excessive voltage or current, whether the current is an overload or a short circuit. Thus, the footprint required on the printed circuit board from that needed with two or more discrete devices occupying two different spaces on the printed circuit board.

Moreover, the disclosed integrated device assures electrical coordination between the voltage suppressor 104 and PTC carrier 106. To this extent, a circuit designer does not have to worry that his/her selection of the two discrete components by, for example, different manufacturers coordinate properly. Thus, the designer can spend more time contemplating other features of the circuit and be assured that the integrated device provides sufficient overvoltage and overcurrent protection.

Figure 6:
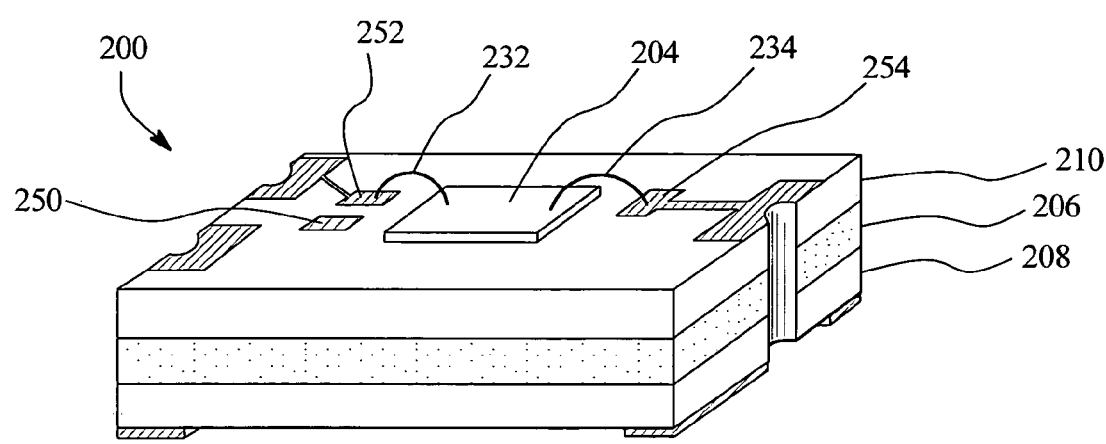
FIG. 6 illustrates a perspective view of a further example of an integrated circuit device according to the present disclosure.
Figure 7:
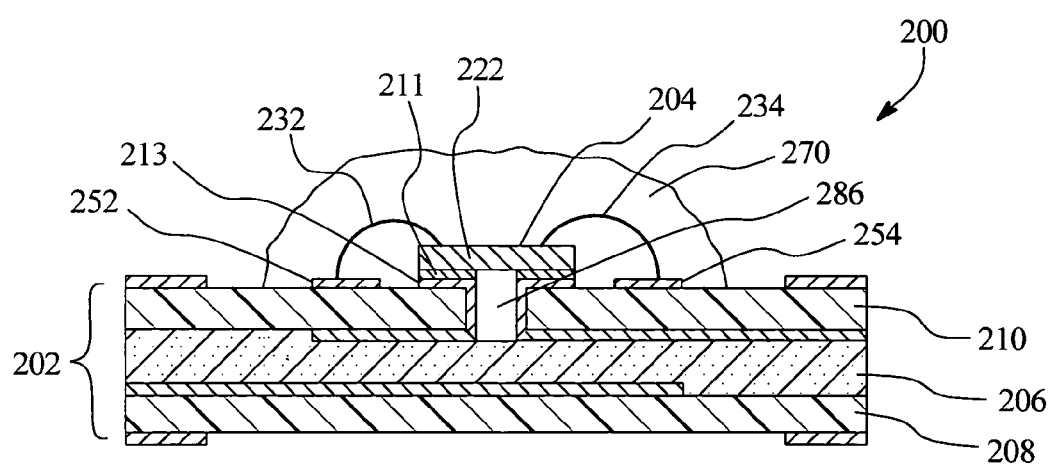
FIG. 7 illustrates a cross-sectional view of the integrated circuit device (including an encapsulation layer) of FIG. 6.

As an alternative to the overcurrent and overvoltage protection device 100 in the package, FIGS. 6 and 7 show an alternative device 200 in a chip on board package. The chip on board device 200 includes a PTC carrier 202 and a bare semiconductor die 204. Similar to the PTC carrier in the device 100, the PTC carrier 202 in this embodiment includes a PTC element 206 and first and second substrates 208, 210. The semiconductor die 204 is attached to a top side 211 of a die bond pad 213 on a PTC carrier 202. The semiconductor die 204 can be attached to the die bond pad 213 by a bond adhesive 222 using conventional solder or conductive epoxy techniques. Bond wires 232, 234 connect bond pads (not shown) of the semiconductor die 204 to the bond pads 252, 254 on the PTC carrier 202. The semiconductor die pad 213 is thermally coupled to the PTC element 206 by one or more vias or heat pipes 286. As described above regarding the design, the vias 286 can be filled either with plating material, a conductive epoxy, a solder or combination thereof, or simply left empty.

The chip on board device 200, may provide even better thermal coupling characteristics because the semiconductor die 204 can sit directly on top of the heat sink and adhesive bond. Indeed, the semiconductor die 204 is in even closer thermal contact with the heat sink 286 and the PTC element 206 than the semiconductor package described above with respect to the device 100.

Moreover, as shown in FIG. 7, a protective encapsulation 270 such as, for example, an epoxy like ultraviolet light cured epoxy, can be applied over the semiconductor die 202 and bond wires 232, 234.

The above devices 100, 200 incorporate voltage suppressors that may have zener diode-like characteristics. Generally, zener diode-like characteristics are ideal for providing protection in direct current ("DC") power applications. Such applications include battery operated equipment, cellular phones, computers, etc.

Figure 1:
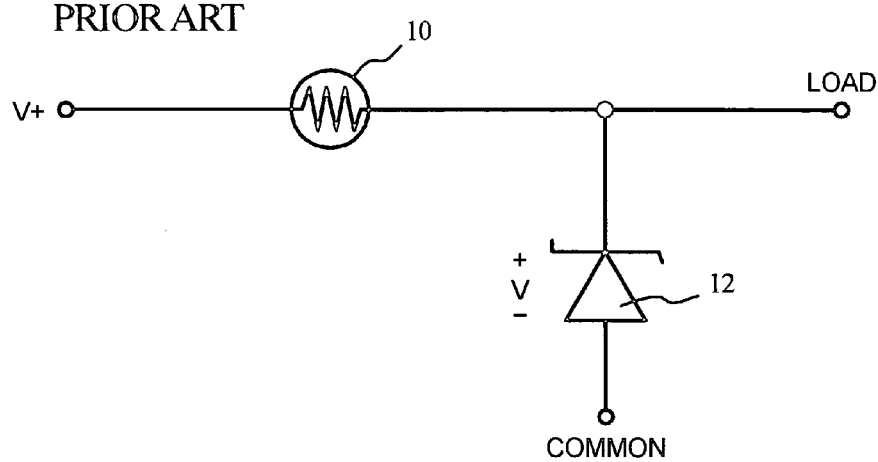
FIG. 1 illustrates a circuit diagram for a conventional circuit that has overcurrent and overvoltage protection.
Figure 8:
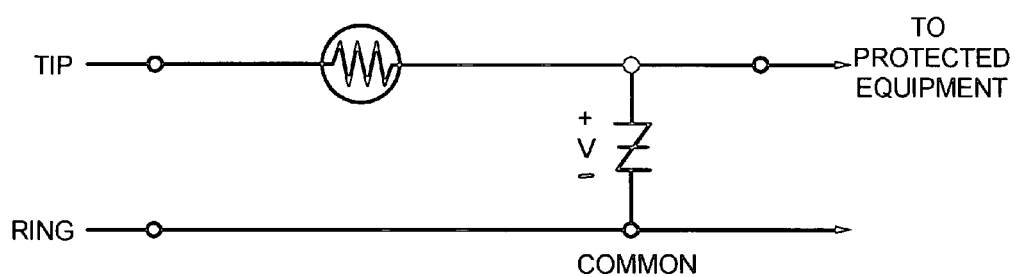
FIG. 8 illustrates a circuit diagram for a circuit that has overvoltage and overcurrent protection for telecommunication applications.
Figure 9:
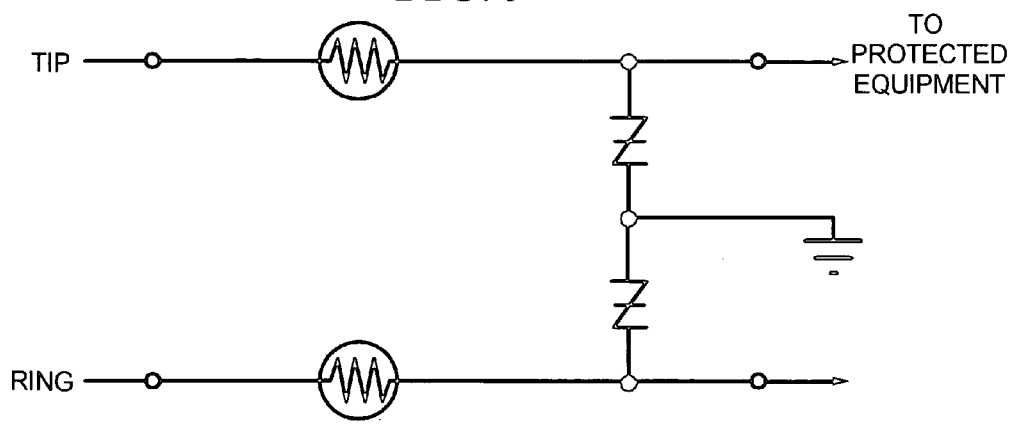
FIG. 9 illustrates another example of a circuit diagram for a circuit that has overvoltage and overcurrent protection for telecommunications applications.

However, the devices 100, 200 can include voltage suppressors having other characteristics useful in protecting against overvoltage conditions for different applications. For example, FIGS. 8 and 9 show a circuit diagram for overvoltage and overcurrent protection of telecommunication equipment. The circuit of FIGS. 8 and 9 are commonly used to protect "Tip" and "Ring" connections such as modems telephones, facsimile machines, and line cards. While the circuit of FIGS. 8 and 9 are appropriate for copper twisted pair environments, other voltage environments are also suitable for circuits sought to be protected such as alarm circuits, power supplies, remove sensors, CATV, data lines, etc.

In this regard, the devices 100, 200 described above can be adapted to protect such systems. In telecommunication systems, thyristor characteristics, preferably that of a bi-directional thyristor, are often necessary to protect sensitive circuitry from harmful excess voltages that can occur, for example, from lightning or when a power line falls across the wiring. Generally, as voltage increases in the thyristor, it reaches a breakdown level in which the voltage folds back and drops to a lower voltage.

Additionally, the overvoltage and overcurrent protection devices discussed herein may include more than one PTC element. Such PTC multi-layer configurations provide for a higher hold current within the same footprint of the device. Examples of such PTC multi-layer configurations is disclosed in U.S. application Ser. No. 09/510,116, filed Feb. 22, 2000, incorporated herein by reference.

Moreover, the overvoltages and overcurrent protection devices may include more than one region of PTC material between the substrates 108, 110. Alternatively, there may be one PTC region with a number of electrodes on the respective surface of each substrate.

Figure 10:
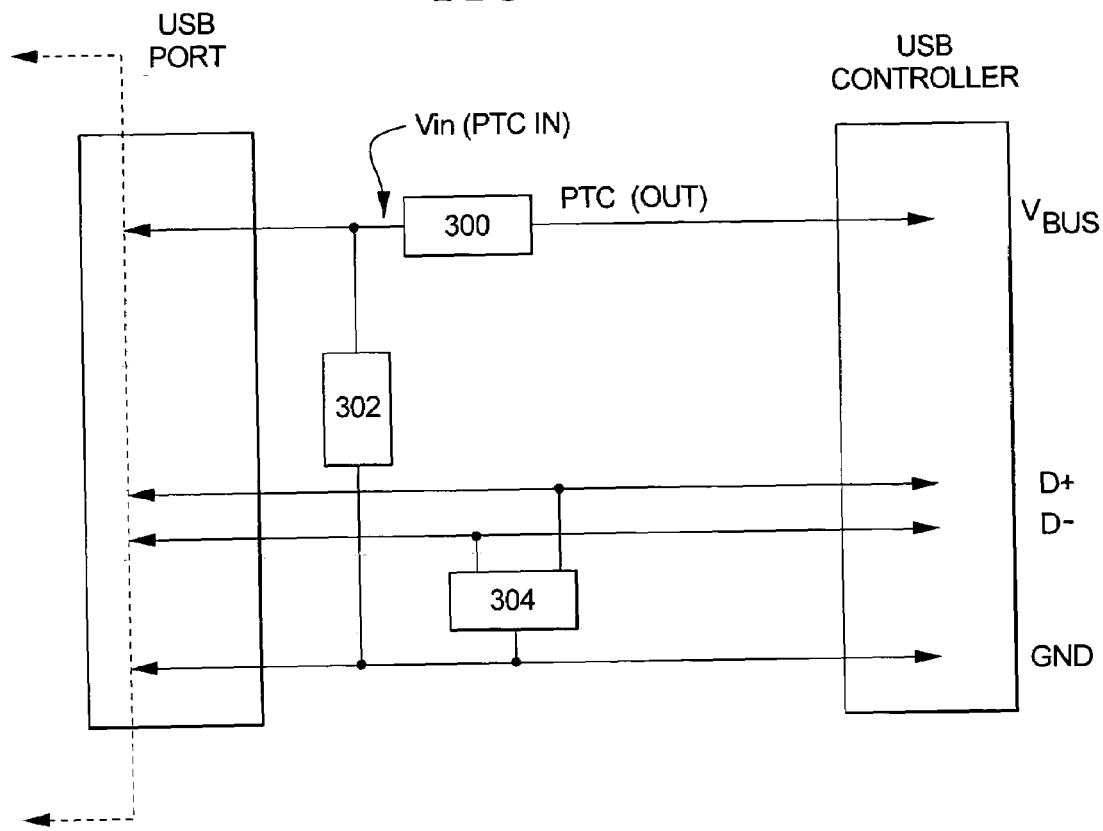
FIG. 10 illustrates a circuit diagram for a circuit that has overvoltage protection and overcurrent protection for Universal Serial Bus ("USB") applications.

FIG. 10 illustrates another circuit diagram involving overvoltage and overcurrent protection in Universal Serial Bus ("USB") applications. This diagram incorporates three discrete devices: a PTC device 300, a varistor 302, and a voltage variable device 304.

Figure 11:
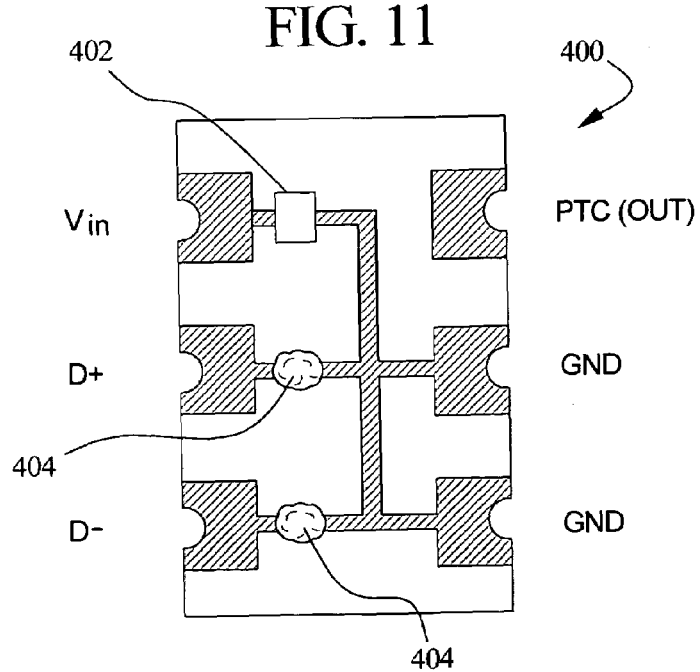
FIG. 11 illustrates a top view of an integrated circuit device performing the overvoltage and over current protection functions.

FIG. 11 illustrates a top view of another exemplary device for overvoltage and overcurrent protection in USB applications. This device 400 includes a PTC carrier (similar to the PTC carriers described above and not shown in FIG. 11) and a varistor 402 as the voltage suppressor for the protection of overvoltage conditions on the $V_{bus}$ line. Additionally, a voltage variable material 404 is incorporated for further protection against electrical overstress ("EOS") transients on the data lines, D+ and D−. The voltage variable material is disposed on the second substrate of the PTC carrier. EOS transients may arise, for example, from an electromagnetic pulse, an electrostatic discharge, lightning, or be induced by the operation of other electronic or electrical components.

As a result of the integration of the three devices of FIG. 10, the overvoltage and overcurrent device 400 provides a single discrete device that assures protection against overcurrents, overvoltages and EOS transients.

Figure 12:
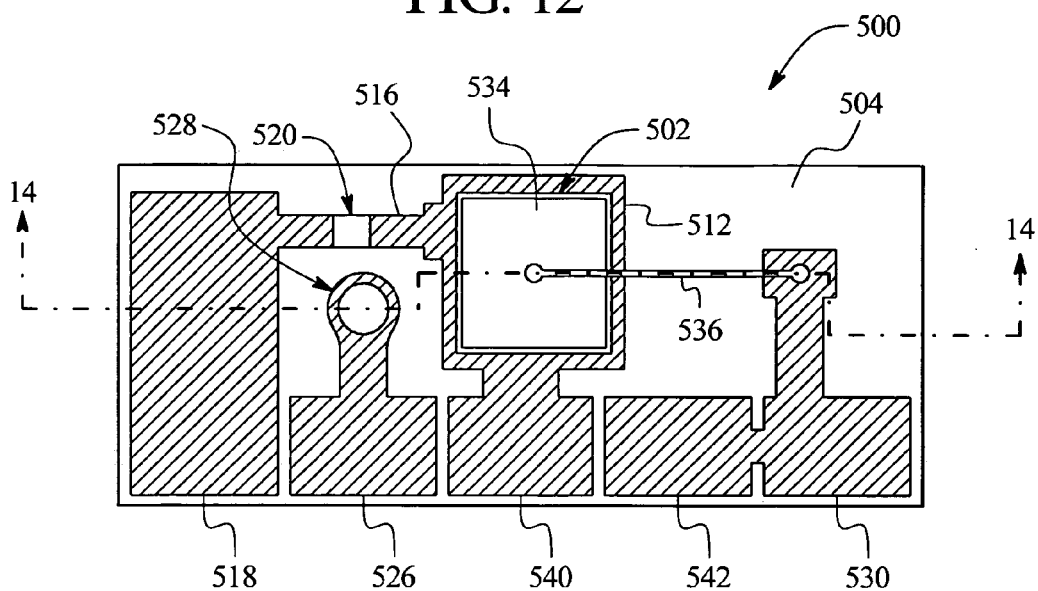
FIG. 12 illustrates a top view of a circuit device according to another example.
Figure 13:
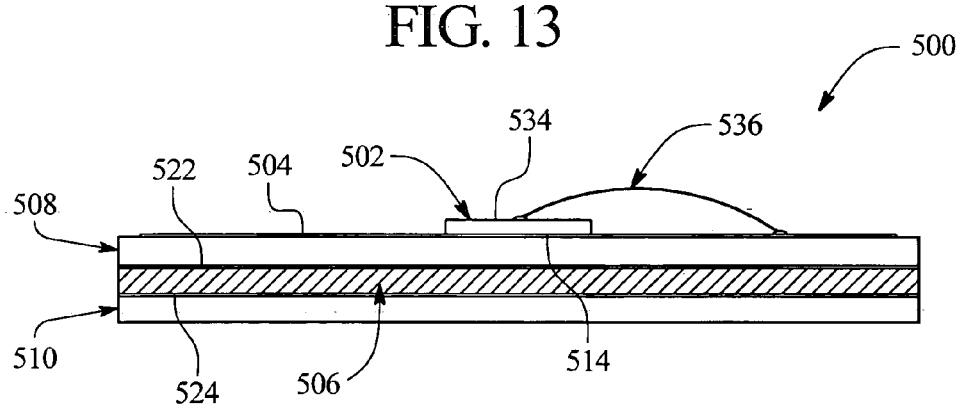
FIG. 13 illustrates a side view of the circuit device of FIG. 12.
Figure 14:
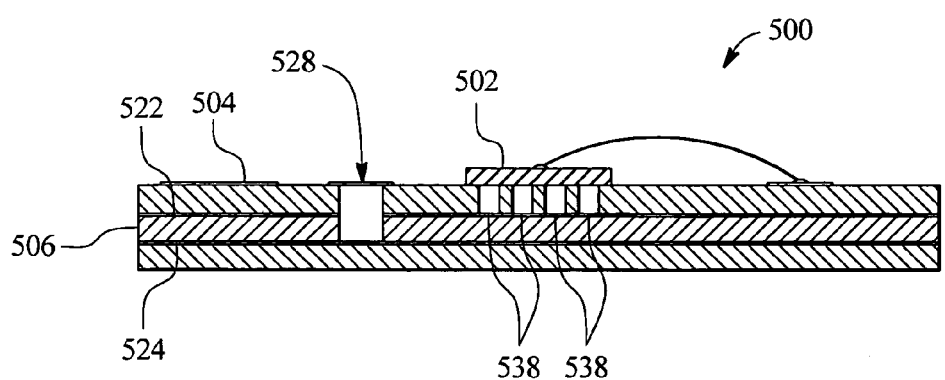
FIG. 14 illustrates a cross sectional view of the circuit device of FIG. 12 along section line 14–14'.

FIGS. 12–14 illustrate an example of another integrated device 500 having overcurrent and overvoltage protection devices for protecting electrical equipment, such as a battery, for example. As shown in FIGS. 12 and 13, a two-sided overvoltage device, such as a Zener diode die 502 is utilized and disposed on an upper surface 504 of the device 500. The device 500 includes a current limiting element such as PTC element 506 interposed between two substrates 508 and 510. The substrates 508 and 510 may be made of any of the materials disclosed previously, such as FR4 epoxy, for example.

Metallized traces are also disposed on the upper surface 504 of the device. Specifically, the Zener diode die 502 is disposed on a metallized trace area 512 that is, in turn, disposed on the surface 504. As shown in the FIG. 12, this trace area 512 may have dimensions and shape that approximately correspond to the dimensions and shape of the die 502, but do not necessarily have to be so. The metallized trace area 512 engenders electrical contact between a first surface 514 of the Zener die 502 and a trace lead 516 that, in turn, connects to a first external electrical contact 518. The trace lead 516 may optionally contain a fuse element 520, also disposed on the surface 504, for further protection of a load, such as a battery (not shown). The fuse element may be disposed by any known methodology in order to integrate the fuse element 520 into the surface 504. One example is by depositing a thin film fuse on the circuit board having layers of different metals (e.g., Cu and Ni). Such fuse devices are discussed in U.S. Pat. Nos. 5,923,239 and 6,043,966, each of which is incorporated herein by reference.

The PTC element 506 interposed between substrates 508 and 510 electrically contacts top and bottom electrodes 522, 524 respectively disposed on lower and upper surfaces of the substrates 508 and 510. These electrodes 522, 524 encompass an area equivalent to area of the substrates 508 and 510, except for via openings in the top electrode 522, as will be discussed in the following text.

The bottom electrode 524 is electrically connected to a second external contact 526 comprised of metallization, which is disposed on the top surface 504 of the device 500, via a conducting via 528, which may be part of the contact 526, that passes through the top substrate 508. The via 528 may include a cylindrical hole having a metallized interior surface that is electrically connected to the external contact 526. Alternatively, the via 528 may comprise different shapes and any equivalent structure that effects electrical contact (e.g., a conductor passing through the substate 508). The via 528, as shown in FIG. 14, is constructed to afford electrical insulation between the top electrode 522 and the via 528 so that electrical contact is made only between external contact 526 and the bottom electrode 524. Additionally, although the disclosed example illustrates one conducting via 528, it will be appreciated by those skilled in the art that multiple conducting vias may be employed in the device 500 in order to effect different electrical connections between layers of the device as desired.

In the example shown, a third external contact 530 is connected to a second surface contact 534 of the die 502 with a bond wire 536. Alternatively, the contact 530 may be connected to contact 534 with a flat conductor or any other type of conductor that affords electrical contact to the second surface 534.

At least one heat conducting structure used to conduct heat from the die 502 to the PTC element 506 is located underneath the die 502 and in the top substrate 508 is. This structure may be heat conducting vias 538 as illustrated in FIG. 14. The vias 538 may be holes through the top substrate 508 to conduct heat through the air in the holes in order to thermally couple the PTC element 506 with the Zener die 502. Additionally, the vias may be metallized or filled with solder or other similar metal useful for conducting heat. In the disclosed example, these structures 538 are also electrically conductive with the metallized trace are 512 in order to electrically connect the top electrode 522 to the bottom contact 514 of the Zener die 502. The trace 512, in turn, may connect to a fourth external contact 540 for connection to various electrical circuits. One skilled in the art will also appreciate that the heat conducting vias 538 do not need to be electrically conducting, just thermally conducting, given alternative connections to the top electrode 522. Additionally, an array of heat conducting vias 538 may be employed in the portion of the top substrate 508 underneath the Zener die 502.

As shown in FIG. 12, the disclosed example also includes an additional fifth contact 542 disposed on the surface 504 connected to contact 530. This exemplifies that various contacts may be disposed, such as by metallized tracing, on the suface 504 (or on other surfaces of the device 500) to effect contacts needed to interface with a particular electrical circuit.

While the teachings of the present disclosure have been explained with respect to particular examples, it will be apparent to those of ordinary skill in the art that the scope of this disclosure is not limited to those examples. On the contrary, this disclosure covers all apparatus and methods falling within the spirit and scope of the appended claims, either literally or under the doctrine of equivalents.

What is claimed is:

1. A circuit protection device, comprising:
   an overcurrent protection portion having a current limiting element and a surface;
   an overvoltage protection portion disposed on the surface via an attachment structure, the attachment structure disposed between the overcurrent protection portion and the overvoltage protection portion and configured to thermally couple the overvoltage protection portion to the overcurrent protection portion by at least one via formed in the overcurrent protection portion; and
   a plurality of terminations configured to connect the overcurrent protection portion and the overvoltage protection portion to a printed circuit board.

2. The device as defined in claim 1 wherein the current limiting element includes a PTC element.

3. The device as defined in claim 1, wherein the overcurrent protection portion includes a first substrate and a second substrate, each substrate having an electrode disposed thereon, and the current limiting element positioned between the first and second substrates and electrically connected to the electrodes.

4. The device as defined in claim 1, wherein the overcurrent protection portion includes a first substrate and a second substrate, each substrate having an electrode disposed thereon, and the current limiting element positioned between the first and second substrates and electrically connected to the electrodes, the second substrate further including the at least one via extending from the surface of the overcurrent protection portion to the current limiting element.

5. The device as defined in claim 4, wherein the at least one via is metallized.

6. The device as defined in claim 4, wherein the overvoltage protection portion is bonded to the overcurrent protection portion through the at least one via.

7. The device as defined in claim 1, wherein the overvoltage protection portion includes a voltage suppressor.

8. The device as defined in claim 1, wherein the overvoltage protection portion includes a voltage suppressor having zener diode-like characteristics.

9. The device as defined in claim 1, wherein the overvoltage protection portion includes a bi-directional thyristor.

10. The device as defined in claim 1, wherein the overvoltage protection portion includes a varistor.

11. The device as defined in claim 1, wherein the overvoltage protection portion includes a voltage suppressor and a voltage variable material.

12. The device as defined in claim 1, wherein the via that extends from the surface to the current limiting element to the overvoltage protection portion to thermally couple the current limiting element through the via.

13. The device as defined in claim 1, wherein the overvoltage protection portion comprises a die having first and second sides each having an electrical contact.

14. The device as defined in claim 13, wherein one of the first and second sides is electrically connected to the overcurrent protection via a metallized trace disposed on the surface of the overcurrent protection portion, wherein the metallized trace is electrically insulated from the current limiting element along the surface.

15. The device as defined in claim 13, wherein one of the first and second sides is electrically connected to a contact via a bond wire.

16. The device as defined in claim 1, further comprising:
the overcurrent protection portion including a first substrate and a second substrate;
the current limiting element positioned between the first and second substrates;
first and second electrodes respectively disposed on surfaces of the first and second substrates such that the current limiting element is positioned between the first and second electrodes;
at least one terminal disposed on the surface and connected electrically to at least one of the first and second electrodes.

17. The device as defined in claim 16, wherein the at least one terminal further includes another portion comprising a via extending through at least the first substrate.

18. The device as defined in claim 16, wherein the at least one terminal further includes another portion comprising a via extending through at least the first substrate, first electrode and the current limiting element.

19. The device as defined in claim 18, wherein the via is electrically insulated from the first electrode.

20. An overcurrent and overvoltage protection device, comprising:
a first substrate having a surface and an electrode disposed on the first surface;
a second substrate having a top surface and a bottom surface and an electrode disposed on the bottom surface;
a PTC element positioned between the first and second substrates and electrically connected to the electrodes;
a voltage suppressor disposed on the top surface of the second substrate and thermally coupled to the PTC element via a heat sink; and
a plurality of terminations electrically connected to the PTC element and the voltage suppressor.

21. The device of claim 20, wherein the heat sink is configured within a footprint of the voltage suppressor, the heat sink extending from the top surface of the second substrate to the PTC element.

22. The device of claim 21, wherein the heat sink includes at least one via, the at least one via being coated with a conductive material.

23. The device of claim 21, wherein the heat sink includes a via, and the voltage suppressor is conductively bonded to the heat sink and via.

24. The device of claim 20, wherein the voltage suppressor has zener diode like characteristics.

25. The device of claim 20, wherein the voltage suppressor includes a bi-directional thyristor.

26. The device of claim 20, wherein the voltage suppressor includes a varistor.

27. The device of claim 20, further comprising:
a voltage variable material disposed on the top surface of the second substrate.

28. The device of claim 20, further comprising:
a voltage variable material disposed on the top surface between an input/output pad and ground.

29. A circuit protection device, comprising:
an overcurrent protection portion interposed between one or more substrate layers of a circuit board;
an overvoltage protection portion attached to the circuit board and thermally coupled to the overcurrent protection portion via a localized heat transferring structure within a least one of the substrate layers; and
at least one terminal configured to connect the circuit protection device to a an external printed circuit board.

30. The device as defined in claim 29 wherein the overcurrent protection portion includes a current limiting element.

31. The device as defined in claim 30, wherein the overcurrent protection portion includes a first electrode and a second electrode with the current limiting element positioned between first and second substrates of the one or more substrate layers and electrically connected to the electrodes.

32. The device as defined in claim 30, wherein the heat transferring structure includes at least one via that extends from a surface of the circuit to the current limiting element, the at least one via configured to thermally couple the overvoltage protection portion to the current limiting element.

33. The device as defined in claim 32, wherein the at least one via is metallized.

34. The device as defined in claim 32, wherein the at least one via is filled with a heat conducting material.

35. The device as defined in claim 32, wherein the overvoltage protection portion is bonded to the circuit board through the at least one via.

36. The device as defined in claim 29, wherein the overvoltage protection portion includes a voltage suppressor.

37. The device as defined in claim 29, wherein the overvoltage protection portion includes a voltage suppressor having zener diode-like characteristics.

38. The device as defined in claim 29, wherein the overvoltage protection portion includes a bi-directional thyristor.

39. The device as defined in claim 29, wherein the overvoltage protection portion includes a varistor.

40. The device as defined in claim 29, wherein the overvoltage protection portion includes a voltage suppressor and a voltage variable material.

41. The device as defined in claim 30, wherein the device includes a via that extends through from the current limiting element and the overvoltage protection portion to thermally couple the current limiting element through the via.

42. The device as defined in claim 29, wherein the overvoltage protection portion comprises a die having first and second sides each having an electrical contact.

43. The device as defined in claim 42, wherein one of the first and second sides is electrically connected to the overcurrent protection via a metallized trace disposed on the surface of the circuit board, wherein the metallized trace is electrically insulated from the current limiting element along the surface.

44. The device as defined in claim 42, wherein one of the first and second sides is electrically connected to a contact via a bond wire.

45. The device as defined in claim 30, further comprising:

the one or more substrate layers including a first substrate and a second substrate;

the current limiting element positioned between the first and second substrates;

first and second electrodes respectively disposed on surfaces of the first and second substrates such that the current limiting element is positioned between the first and second electrodes;

at least one terminal disposed on the surface and connected electrically to at least one of the first and second electrodes.

46. The device as defined in claim 45, wherein the at least one terminal further includes another portion comprising a via extending through at least the first substrate.

47. The device as defined in claim 45, wherein the at least one terminal further includes another portion comprising a via extending through at least the first substrate, first electrode and the current limiting element.

48. The device as defined in claim 47, wherein the via is electrically insulated from the first electrode.

* * * * *